United States Patent [19]
Orcutt

[11] Patent Number: 5,904,548
[45] Date of Patent: May 18, 1999

[54] TRENCH SCRIBE LINE FOR DECREASED CHIP SPACING

[75] Inventor: John W. Orcutt, Richardson, Tex.

[73] Assignee: Texas Instruments Incorporated, Dallas, Tex.

[21] Appl. No.: 08/752,822

[22] Filed: Nov. 21, 1996

[51] Int. Cl.$^6$ ................................................. H01L 21/46
[52] U.S. Cl. ........................................... 438/462; 438/460
[58] Field of Search .................................. 437/226, 227, 437/924; 148/DIG. 28; 438/460, 461, 462, 463

[56] References Cited

U.S. PATENT DOCUMENTS

| | | | |
|---|---|---|---|
| 4,534,804 | 8/1985 | Cade | 437/924 |
| 4,604,161 | 8/1986 | Araghi | 156/645 |
| 4,961,821 | 10/1990 | Drake et al. | 437/226 |
| 5,128,282 | 7/1992 | Ormond et al. | 437/226 |
| 5,196,378 | 3/1993 | Bean et al. | 437/226 |
| 5,219,796 | 6/1993 | Quinn et al. | 437/227 |
| 5,272,114 | 12/1993 | van Berkum et al. | 437/226 |
| 5,284,792 | 2/1994 | Forster et al. | 437/DIG. 28 |
| 5,350,704 | 9/1994 | Anderson et al. | 437/924 |
| 5,369,060 | 11/1994 | Baumann et al. | 437/226 |
| 5,418,190 | 5/1995 | Cholewa et al. | 437/226 |

FOREIGN PATENT DOCUMENTS

| | | |
|---|---|---|
| 0 305 204 | 3/1989 | European Pat. Off. . |
| 58-53830 | 3/1983 | Japan ..................... 437/924 |

*Primary Examiner*—Kevin Picardat
*Attorney, Agent, or Firm*—Alan K. Stewart; Wade James Brady, III; Richard L. Donaldson

[57] ABSTRACT

A method of scribing and separating chips on a semiconductor wafer (21) wherein the wafer (21) is patterned and a pattern of intersecting grooves is etched on a selected surface of the semiconductor wafer (21) in a pattern, preferably in a grid pattern, to define chip areas on that surface. Trenches (27) are then formed in the shape of the pattern and the selected surface is adhered to a tape (29). Light is then passed through the tape (29) and semiconductor wafer (21) from the pattern and a pattern of intersecting saw cuts or grooves (28) aligned with the light passing through the wafer (21) is formed. The saw cuts (28) extend from a surface of the wafer (21) opposing the selected surface and are aligned with the pattern of intersecting trenches (27).

6 Claims, 1 Drawing Sheet

TRENCH SCRIBE LINE FOR DECREASED CHIP SPACING

BACKGROUND OF THE INVENTION

1. Field of the Invention

This invention relates to a method and system for scribing and separating semiconductor chips formed on a semiconductor wafer.

2. Brief Description of the Prior Art

Chips formed on a single wafer of semiconductor material have generally been scribed and separated in the prior art by one of several available procedures. These prior art procedures generally provide for attachment of the wafer to an adhesive handling film with subsequent fracturing taking place along "streets" between rows and columns of chips to separate the chips. The chips are then removed from the handling film and processed in standard manner.

Fracturing of the wafer has generally been accomplished by (1) laser scribing a depression in the wafer along the "streets" and then breaking the wafer the rest of the way, (2) sawing a depression in the wafer along the "streets and then breaking the wafer the rest of the way, or (3) sawing entirely through the wafer along the "streets".

A problem arising from the above described prior art techniques has been the large amount of semiconductor material or chip surface area wasted due to the large "street" widths required in order to prevent damage to chips during chip separation. In the case of fracturing by the procedures listed above as (1) and (2), there is the possibility that the break in the wafer below the depression will not be straight, resulting in chips of non-uniform dimensions. Also, sawing can causes fractures at the wafer surface, this being a source of defects and decreased yields when sawing takes place at the surface containing the electrical components.

SUMMARY OF THE INVENTION

In accordance with the present invention, there is provided a method and system for scribing semiconductor wafers and separating chips formed on and in the wafers which substantially diminishes the above enumerated problem presented by the prior art procedures.

Briefly, the improvement is accomplished by etching trenches in the wafer of semiconductor material to replace the "streets" of the prior art. Etching takes place in standard manner with patterning and etching to define each chip area on the wafer surface, either at the commencement, during or after fabrication of the chips. Chip separation then involves securing the trench-containing surface to a die bonding adhesive tape and then sawing a groove from the reverse side in the direction of the trench either spaced from the trench or to the trench. When the trench extends partly through the wafer, separation can be completed in the same manner as in the prior art as discussed above, namely by breaking, as the preferred procedure. The saw or other groove-forming forming procedure is aligned with the trench at this time by, for example, passing a light to which the wafer is somewhat transparent, such as infrared in the case of a silicon wafer, through the masked wafer. This procedure minimizes the damage to the active surface of the chip caused by sawing on the chip surface containing the electrical components as practiced in the prior art.

It can be seen that the procedures of the present invention minimize the "street" widths required by about one order of magnitude since trenches formed by etching can be more accurately controlled than can sawing or laser scribing of the prior art. It is also apparent that the accuracy required in the sawing operation from the reverse surface of the wafer is much less critical than in the prior art since it is merely necessary that the saw cut be somewhere in the vicinity of the trench at some point within the wafer body and spaced from the active surface. Furthermore, damage to the active surface of each chip is minimized because sawing and/or laser scribing do not take place at that surface.

DESCRIPTION OF THE PREFERRED EMBODIMENT

Figure 1:
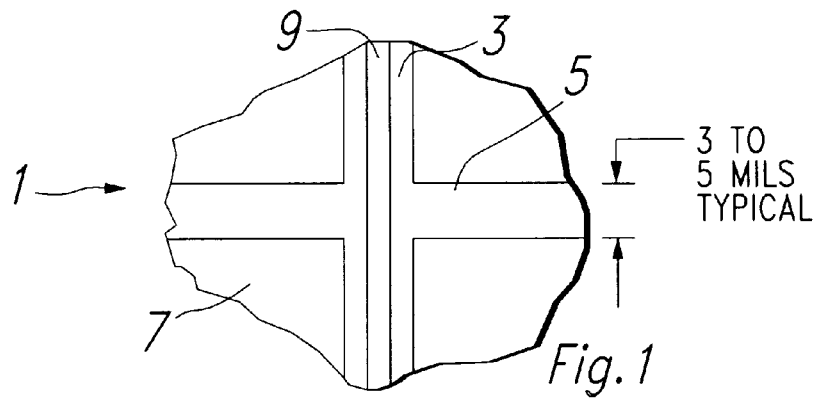
FIG. 1 is a top view of a portion of a partially fabricated semiconductor wafer in accordance with the prior art.
Figure 2:
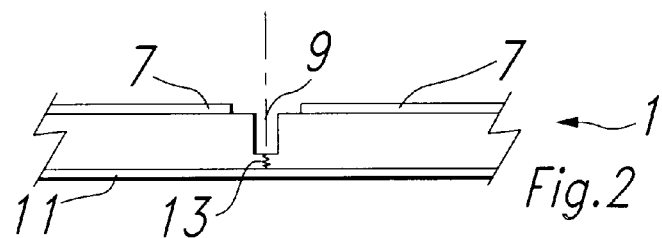
FIG. 2 is a cross sectional view taken along the line 2—2 of FIG. 1.

Referring first to FIGS. 1 and 2, there is shown a portion of a typical, partially fabricated prior art wafer 1 having "streets" 3 in the vertical direction and 5 in the horizontal direction defining chips or dice 7. The chips 7 are separated from each other by use of one of the above described prior art techniques which initially provides a cut 9 in the "street" 3 and a similar cut in the "street" 5 (not shown) followed by severing or breaking along the line 13. The "streets" 3 and 5 generally have a width in the range of about 3 to 5 mils to accommodate for some misalignment of the scribing apparatus as well as to minimize surface damage to the chip from sawing or the like. The prior art fabrication techniques involve securing of the wafer to a handling film 11, which is generally a flexible film with an adhesive thereon, prior to commencement of any of the scribing operations as shown in FIG. 2.

Figure 3:
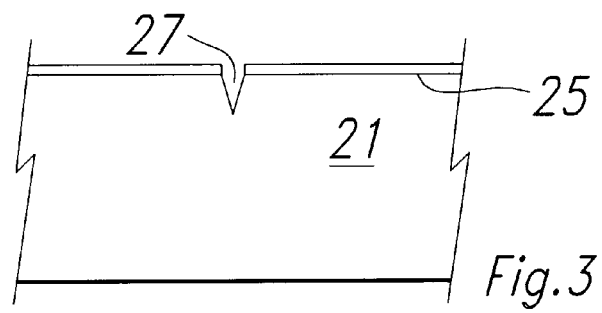
FIGS. 3 to 5 are a partial process flow for fabrication of semiconductor chips in accordance with the present invention.
Figure 4:
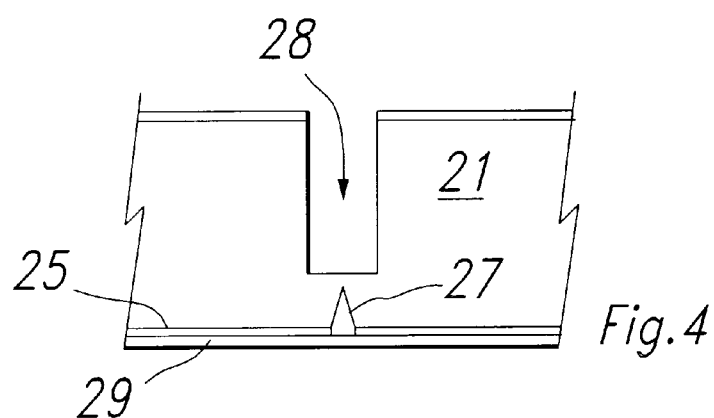
Figure 5:
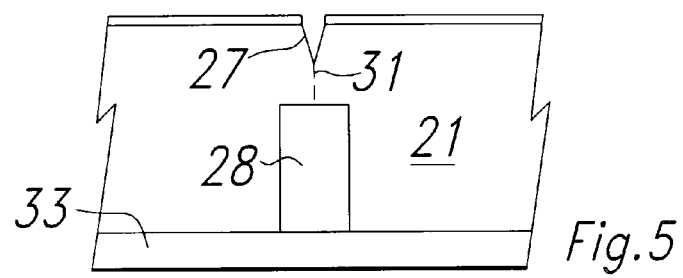

Referring now to FIGS. 3 to 5, there is shown a partial process flow for fabrication of chips in accordance with the present invention. In FIG. 3, there is shown a cross section of a semiconductor wafer 21 in accordance with the present invention showing the wafer with the active surface 25 and a trench 27 which has been etched into the active surface of the wafer to define chips on the wafer.

The wafer 21 is secured by the active surface 25 thereon to a saw tape 29, which can be an adhesive material similar to the handling film and transmissive to the light frequencies to be passed therethrough as discussed hereinbelow if such light is utilized, as shown in FIG. 4. A saw cut or groove 28 is then made which is aligned with the trench 27 and preferably extends to a small distance above the trench as shown in FIG. 4. The groove 28 can extend to the trench 27 as an alternate embodiment. The light can be, for example, infrared light in the case of a silicon wafer since silicon is transparent to such light frequencies. The light or other aligning operation will be chosen to be compatible with the semiconductor wafer material being used to provide the alignment function.

The wafer 21 is then removed from the saw tape 29 and the surface with the groove 28 is again secured to a handling film 33, which can be an adhesive material similar to the handling film discussed hereinabove, and the chips are then separated by breaking or the like as in the prior art along the line 31 between trench 27 and groove 28 as shown in FIG. 5. The breaking step is not required if the groove 28 has been sawed to contact the trench 27.

It can be seen that there has been provided a procedure for defining and separating chips fabricated on a wafer which requires far less spacing between chip areas than is required by prior art procedures, thereby saving surface areas and permitting more chips to be fabricated in the same wafer area compared with the prior art.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A method of separating chips on a semiconductor wafer comprising the steps of:
   (a) providing a semiconductor wafer;
   (b) etching a pattern of intersecting trenches on a selected surface of said wafer to define chip areas on said surface;
   (c) forming a groove extending from a surface of said wafer opposing said selected surface aligned with said pattern of intersecting trenches; and
   (d) breaking the region of semiconductor material in said wafer between said groove and said pattern of intersecting trenches to form individual chips.

2. The method of claim 1 wherein said step of etching a pattern includes the steps of masking said selected surface to define a grid pattern and then etching said grid pattern to form said trenches.

3. The method of claim 1 wherein said step of forming a groove comprises the steps of passing detectable energy through said semiconductor wafer from said trenches and then forming said groove aligned with said energy passing through said trenches.

4. The method of claim 2 wherein said step of forming a groove comprises the steps of passing detectable energy through said semiconductor wafer from said trenches and then forming said groove aligned with said energy passing through said trenches.

5. The method of claim 3 wherein said energy is a light having a frequency transmissive through said semiconductor wafer, said step of forming a groove further comprises the step of adhering said wafer to a tape transmissive to light having said frequency prior to passing light through said wafer.

6. The method of claim 4 wherein said energy is a light having a frequency transmissive through said semiconductor wafer, said step of forming a groove further comprises the step of adhering said wafer to a tape transmissive to light having said frequency prior to passing light through said wafer.

* * * * *